(12) United States Patent
Kauffmann

(10) Patent No.: US 9,543,769 B2
(45) Date of Patent: Jan. 10, 2017

(54) POP UP ELECTRICAL APPARATUS

(71) Applicant: Alan Kauffmann, Seattle, WA (US)

(72) Inventor: Alan Kauffmann, Seattle, WA (US)

( * ) Notice: Subject to any disclaimer, the term of this patent is extended or adjusted under 35 U.S.C. 154(b) by 445 days.

(21) Appl. No.: 13/657,790

(22) Filed: Oct. 22, 2012

(65) Prior Publication Data
US 2013/0113425 A1 May 9, 2013

Related U.S. Application Data

(60) Provisional application No. 61/549,675, filed on Oct. 20, 2011.

(51) Int. Cl.
| | |
|---|---|
| *H02J 7/00* | (2006.01) |
| *H05K 5/06* | (2006.01) |
| *H02G 3/18* | (2006.01) |
| *B60L 11/18* | (2006.01) |

(52) U.S. Cl.
CPC .......... *H02J 7/0042* (2013.01); *B60L 11/1825* (2013.01); *H02G 3/185* (2013.01); *H05K 5/069* (2013.01); *Y02T 10/7005* (2013.01); *Y02T 90/121* (2013.01); *Y02T 90/128* (2013.01); *Y02T 90/14* (2013.01)

(58) Field of Classification Search
CPC ....... Y02T 90/12; Y02T 90/164; H02J 7/0042; H05K 5/069
USPC ........................................ 320/109; 174/50.52
See application file for complete search history.

(56) References Cited

U.S. PATENT DOCUMENTS

| | | |
|---|---|---|
| 2,811,574 A | 10/1957 | Guerrero |
| 3,433,886 A | 3/1969 | Myers |
| 3,594,693 A | 7/1971 | Robbins |
| 3,646,244 A | 2/1972 | Cole |
| 3,794,956 A | 2/1974 | Dubreuil |
| 4,984,982 A | 1/1991 | Brownlie et al. |
| 5,023,396 A | 6/1991 | Bartee et al. |
| 5,122,069 A | 6/1992 | Brownlie et al. |
| 5,342,993 A | 8/1994 | Siems |

(Continued)

FOREIGN PATENT DOCUMENTS

WO PCT/US2011/057576 A2 3/2012

OTHER PUBLICATIONS

Website: http://www.burkhardtdesignbuild.com.

(Continued)

*Primary Examiner* — M'Baye Diao
(74) *Attorney, Agent, or Firm* — Apex Juris, PLLC; Tracy M. Heims

(57) ABSTRACT

An electric supply pop up apparatus for use in a generally horizontal surface that has three main sections, first, a permanently installed, weatherproof containment unit where the unit has a bottom, at least one side wall and an open top; second, a moveable tower that has at least one side wall and a cover; and at least one electrical receptacle module installed in said tower; the tower is slideably moveable within the containment unit so that the tower can be raised or lowered within the containment unit such that when the tower is lowered and in a down position the tower is fully secured and enclosed within the containment unit or the tower can be raised to an up position so that the electrical receptacle module is accessible to a user; and where power is available at the electrical receptacle module when the tower is in the up position.

17 Claims, 17 Drawing Sheets

(56) References Cited

U.S. PATENT DOCUMENTS

| | | | |
|---|---|---|---|
| 5,705,772 | A | 1/1998 | Brown |
| D392,254 | S | 3/1998 | Gevaert |
| D405,051 | S | 2/1999 | Byrne |
| D405,052 | S | 2/1999 | Byrne |
| D406,102 | S | 2/1999 | Byrne |
| D406,103 | S | 2/1999 | Byrne |
| D407,374 | S | 3/1999 | Byrne |
| D412,695 | S | 8/1999 | Byrne |
| D412,696 | S | 8/1999 | Byrne |
| D412,697 | S | 8/1999 | Byrne |
| D412,698 | S | 8/1999 | Byrne |
| D420,327 | S | 2/2000 | Byrne |
| 6,028,267 | A | 2/2000 | Byrne |
| 6,046,405 | A | 4/2000 | Obermann |
| 6,234,812 | B1 | 5/2001 | Ivers et al. |
| 6,290,518 | B1 | 9/2001 | Byrne |
| 6,329,595 | B1 | 12/2001 | Roberts |
| D463,775 | S | 10/2002 | Byrne |
| D472,213 | S | 3/2003 | Byrne |
| 7,105,745 | B2 | 9/2006 | Drane |
| 7,276,662 | B2 | 10/2007 | Drane |
| 7,301,100 | B2 | 11/2007 | Drane |
| 7,635,110 | B2 | 12/2009 | Galasso et al. |
| 8,007,295 | B2 | 8/2011 | Lin |
| 8,242,365 | B2 | 8/2012 | Galasso et al. |
| 2010/0277121 | A1* | 11/2010 | Hall et al. .............. 320/108 |
| 2012/0108085 | A1 | 5/2012 | Row |
| 2012/0119698 | A1* | 5/2012 | Karalis et al. ......... 320/108 |

OTHER PUBLICATIONS website: http://robertgmcarthurstudios.com/blog/2011/01.
website: http://www.cupboardsonline.com/2012/01/genius-moment-carlon-pop-up-receptacle.html.
website: http://somemarkets.wordpress.com/tag/emergence/.
website: http://www.evoline-usa.com/.
website: http://www.closet-masters.net/sortbypower.aspx.
website: http://www.lulusoso.com/co/zjecl74.html.
website: http://www.taroto.jp/site/pdf/012/132.pdf.
website: http://www.gzgoge.com.
website: http://www.bjjinshi.com/e/index1.asp.
website: http://www.avsunking.com/.
website: http://ptn-interface.com/en/index.asp.
website: http://www.bjanxin.cn/en/default.aspx.
website: http://www.fulam.com.cn/.
website: http://www.omeenet.com/.
website: http://www.mingye.com/.
website: http://www.igercn.com/.
website: http://www.chuangd.com/.
website: http://www.wei-hua.net/en__About_Us.asp.
website: http://www.mockett.com/pdf/Reprint_Technology.pdf.
website: http://www-public.tnb.com/pub/node/319.
website: http://www.cableorganizer.com/pop-n-plug/pop-n-plug-power-data-center.htm.
website: http://www.mkelectric.com/en-IN/Products/CM/floor/Pages/default.aspx.
website: http://www.divyaele.com/.
website: http://www.altimahitech.com/.

* cited by examiner

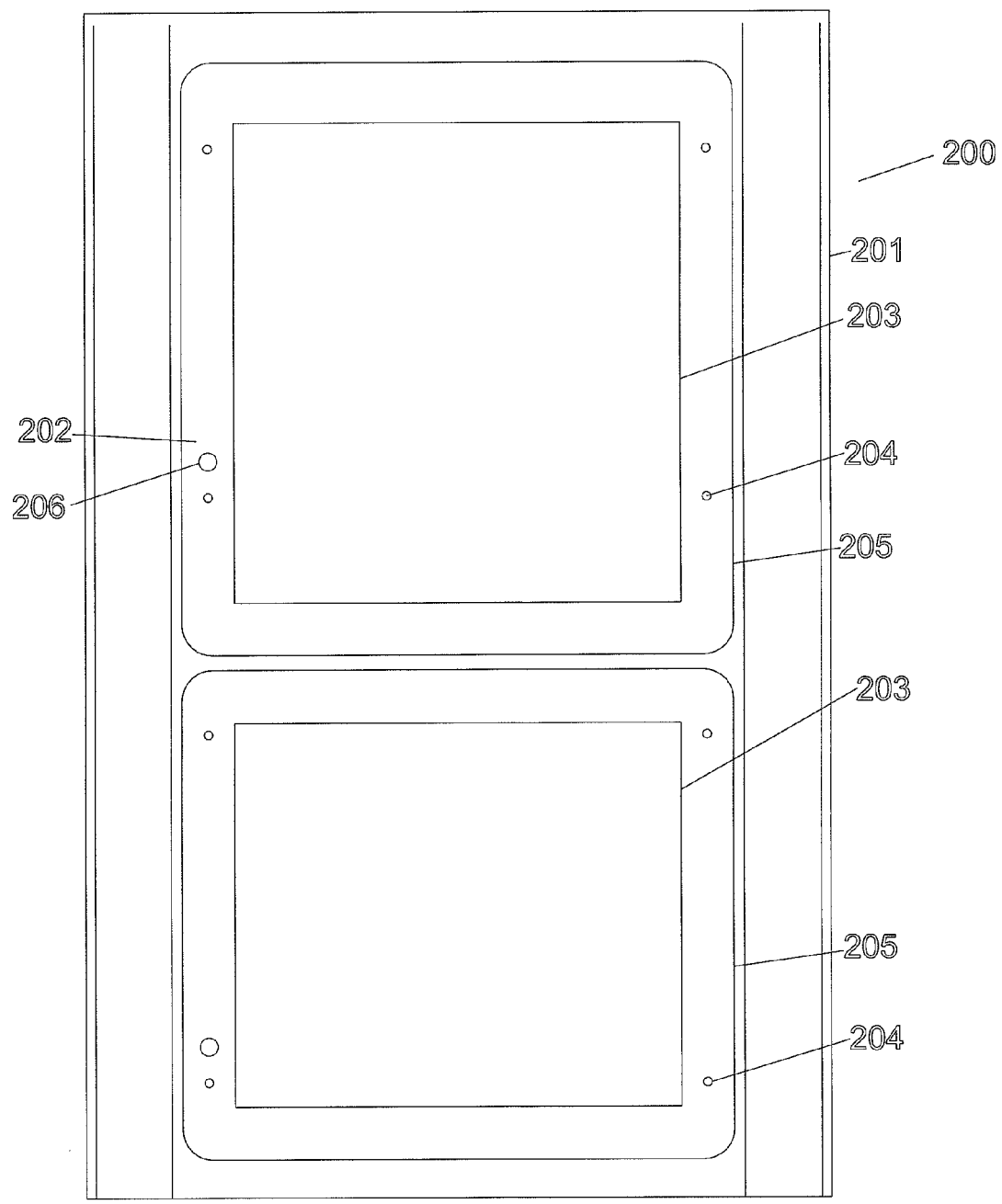

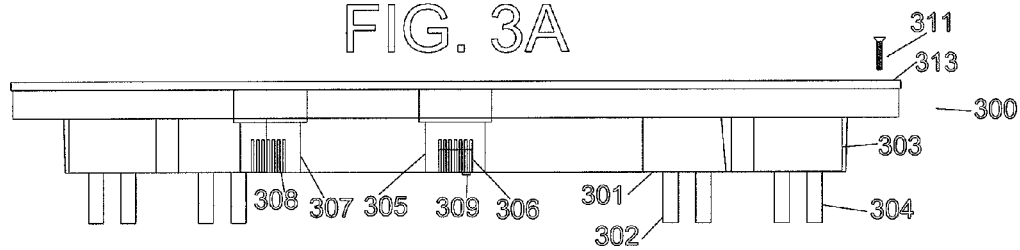
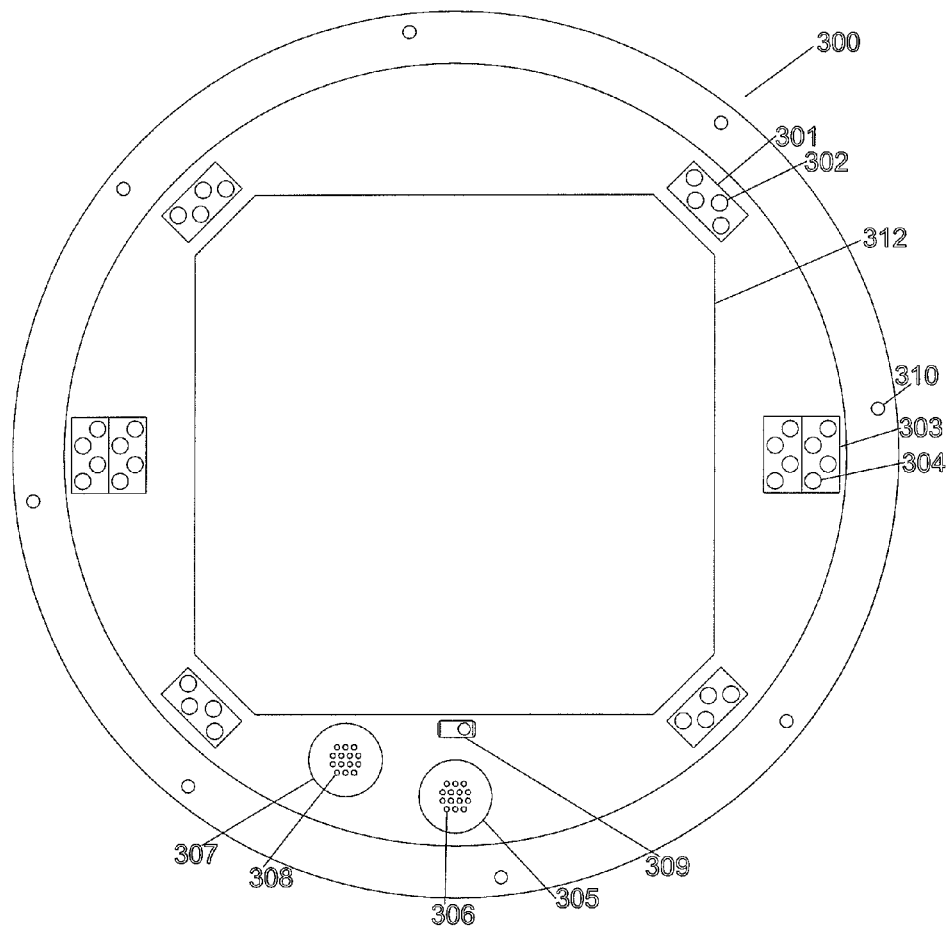

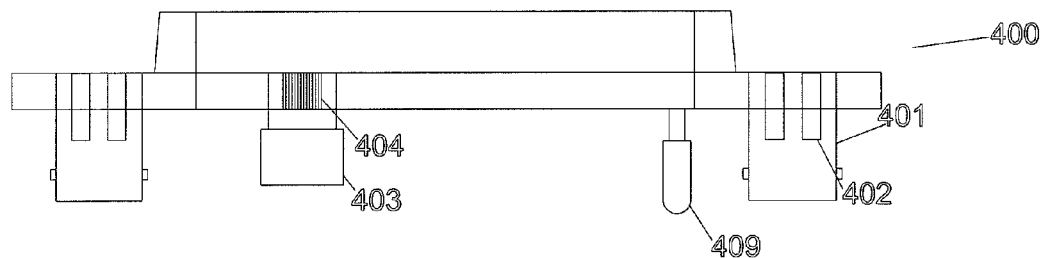
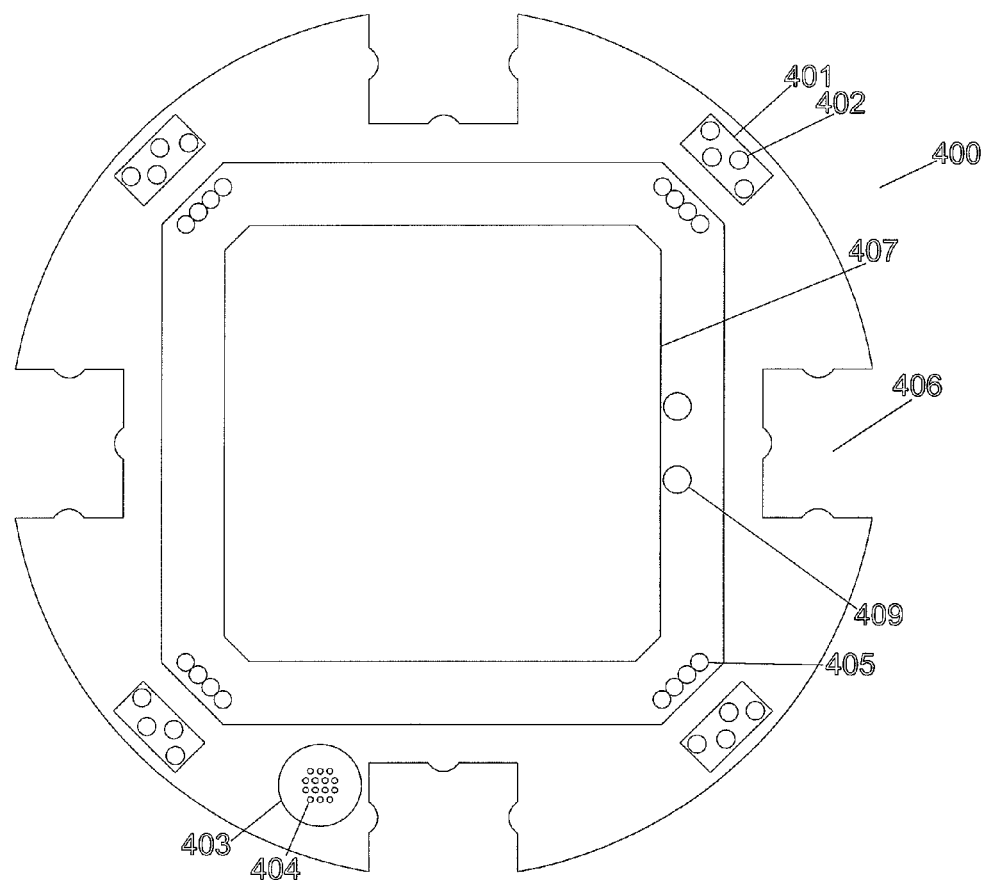

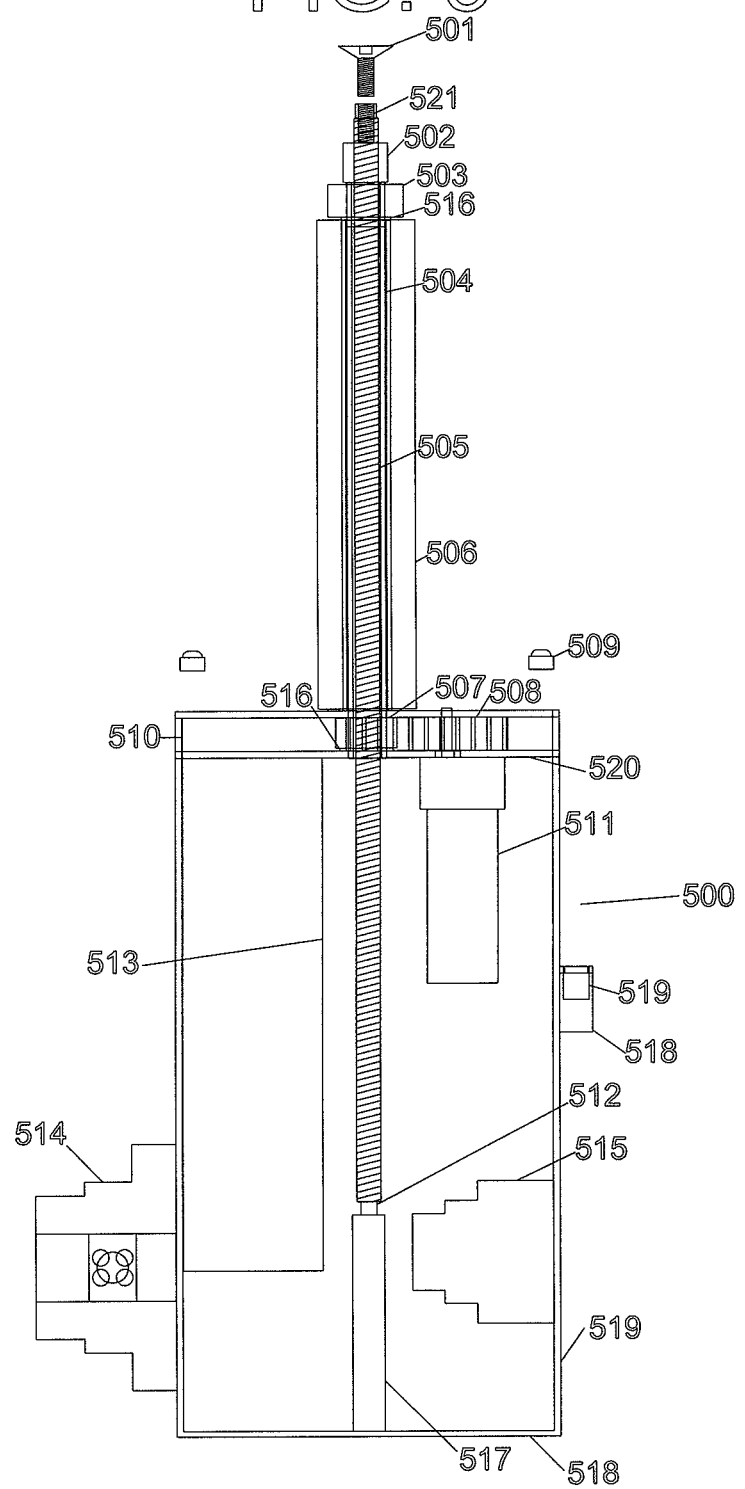

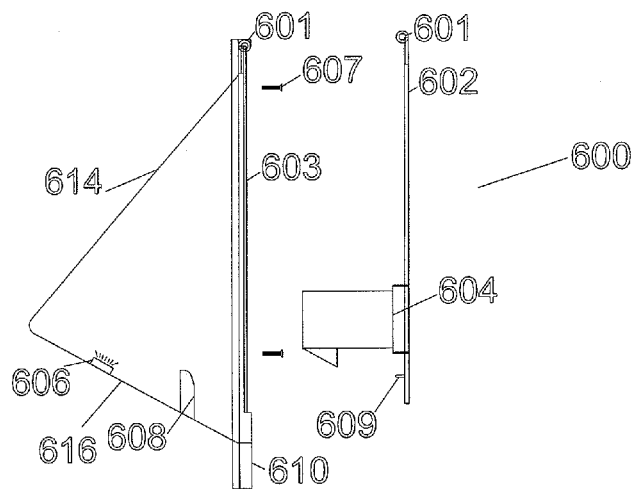
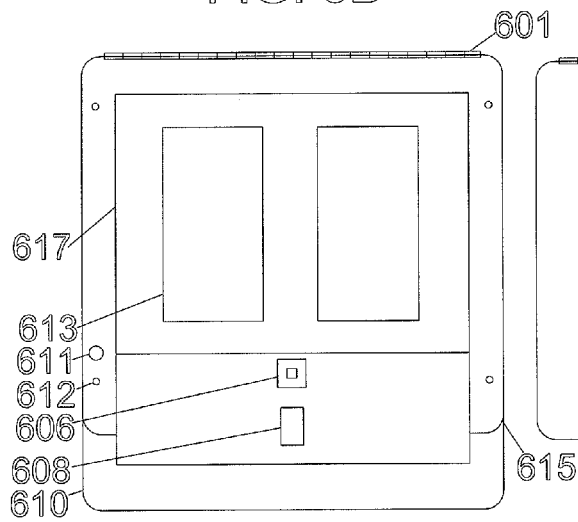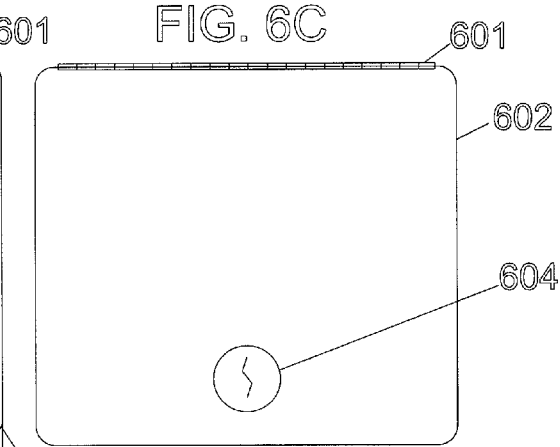

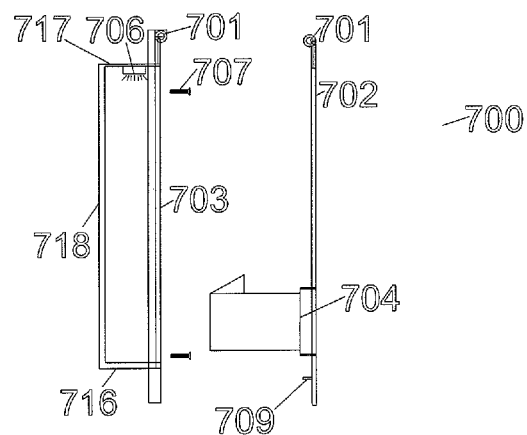
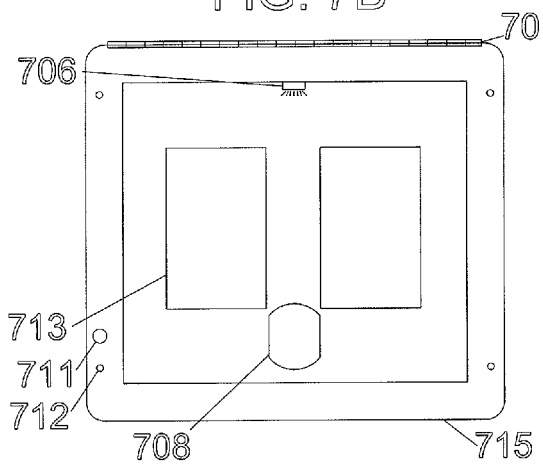
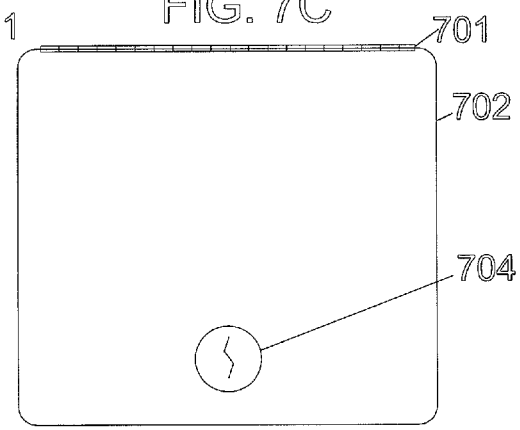

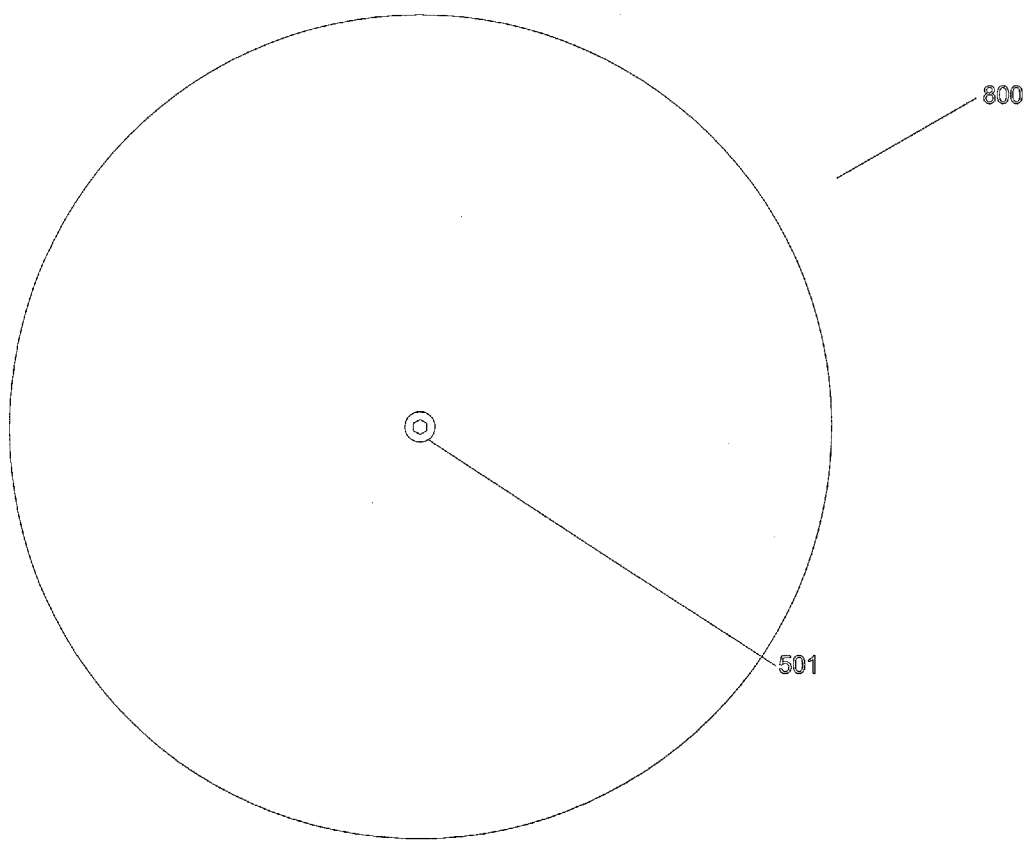

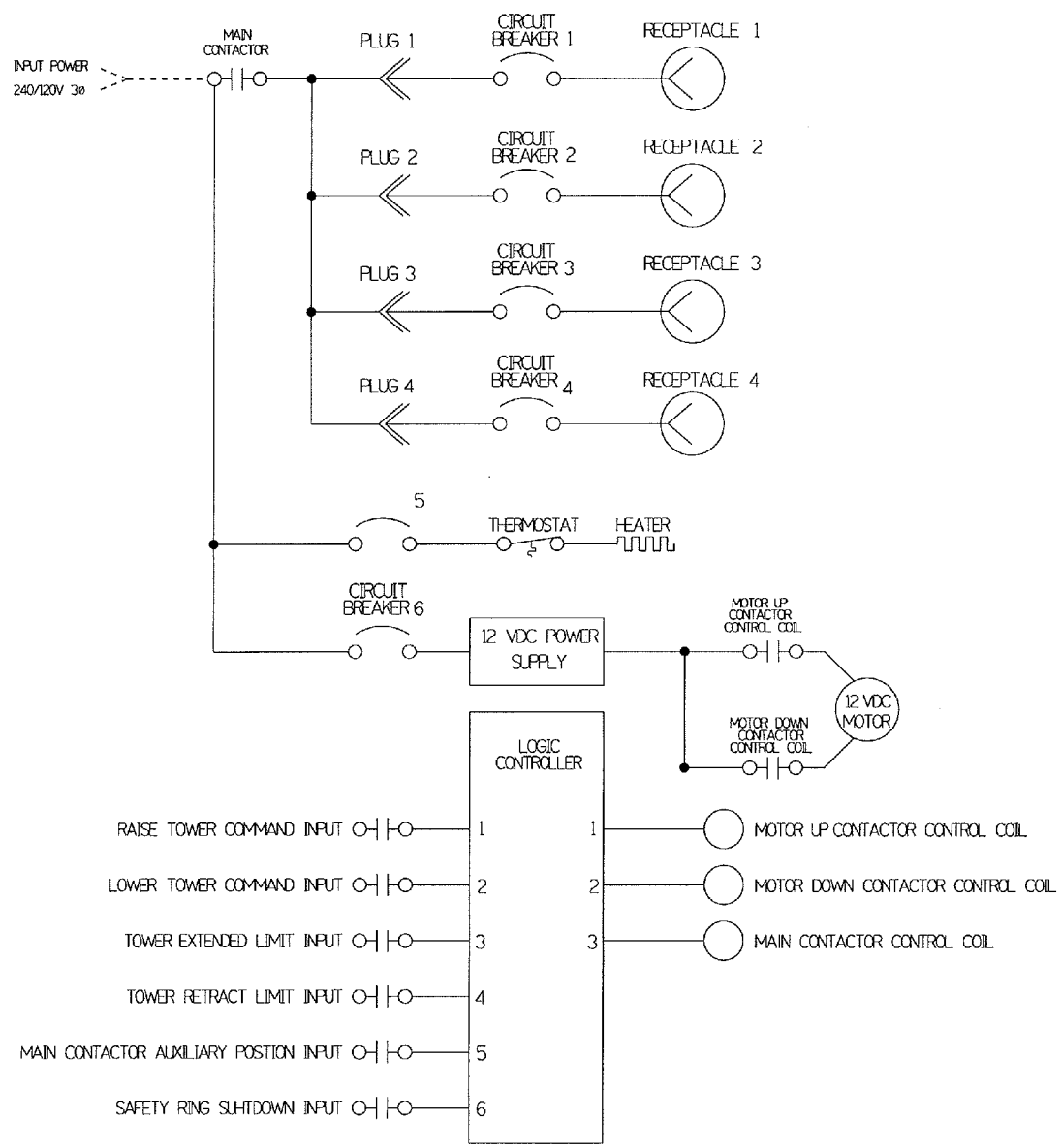

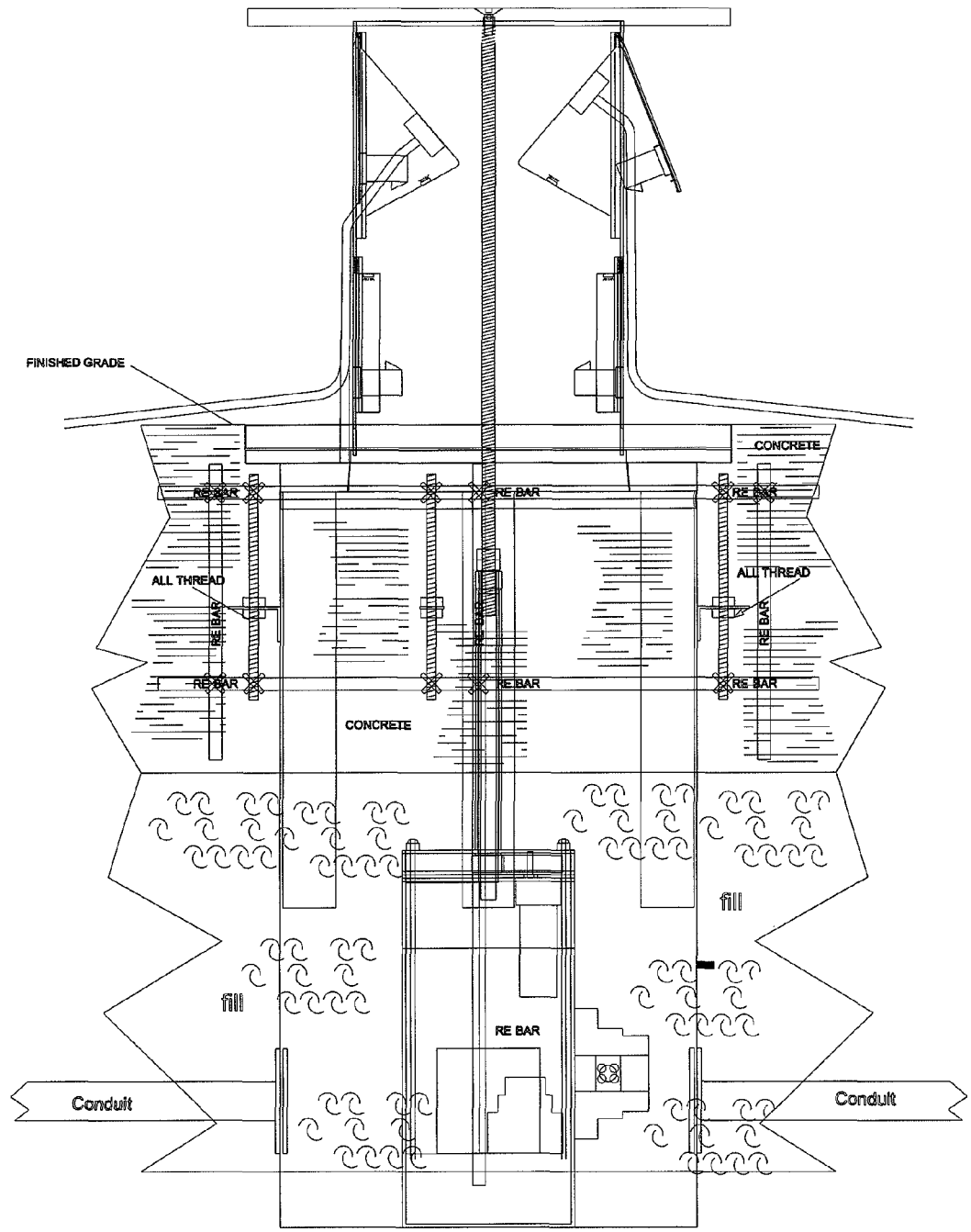

POP UP ELECTRICAL APPARATUS

FIELD OF THE INVENTION

This invention relates generally to electrical outlets and receptacles or data outlets and receptacles, including those which are usually mounted in walls and other vertical surfaces and are functionally adapted to receive electrical plugs to supply electric current to various electrical appliances and devices or to receive data plugs and connectors to supply data. More particularly, it relates to an electrical outlet and receptacle or data assembly which can be opened from and retracted to a position below a horizontal surface, specifically a walking surface, to hide and secure the receptacle when such is desired or required. It also will provide an environmentally or weather secure way to hide and protect the device when not in use. Additionally, it could be used as a secure, electric vehicle pop up charging station.

BACKGROUND OF THE INVENTION

It has long been recognized that water and other liquids, or dirt and other debris can easily enter electrical outlets and receptacles and cause electrical shorts. This is particularly true where, for example, an electrical outlet is mounted to a horizontal surface, particularly when the device is located outside. For that reason, such outlets, when placed for industrial use or application, are located either vertically above or below the horizontal surface of a walkway or other ambulatory surface. Any water or liquid situated on that horizontal surface would be incapable of penetrating the outlet located above the horizontal surface when the outlet is mounted vertically. In the case of a walkway or other ambulatory surface where there is no physical ability to place such an outlet or receptacle above the ground or walkway, simply because there is no wall in which to locate the receptacle, the only option is to provide a long cord with a receptacle at the end to provide electricity or to provide a box that is permanently raised above ground level. This is inconvenient, is hazardous, and is not visually appealing. Such conventional placement of the electrical outlets, receptacles and cords limits the availability of electricity and the ease of access. Additionally, such placement of outlets using cords can create fire hazards, can block walkways, can cause liability due to the cords lying on the ground and does not provide for easy access to electricity. Cords can be cut or damaged to the point of causing a short circuit, and subsequently, possible damage to hardware plugged into them. It can also result in a violation of the National Electrical Code.

With the increased use of electric cars there has been an increased desire to have easy yet secure access to electricity. This is currently being done in the United States with charging stations. The present invention provides a way to install a secure charging station that would provide a means to secure the charging cables and components when not in use and would also provide a way to charge users for the use of the stations and the electricity.

SUMMARY OF THE INVENTION

It is, therefore, a principal object of this invention to provide a new, useful and uncomplicated device that consists of a recessable, pop up electrical outlet and receptacle that can be flush mounted with the ground or walking surface. It is a further object of this invention to provide such an apparatus which requires only a minimal number of elements and which requires only a minimal number of steps to utilize. It is yet another object of this invention to provide such an apparatus which can be safely used in an environment where water or other liquids may, from time to time, be exposed to it and which is in full compliance with the National Electrical Code. It is a further object of this invention to provide an apparatus that is water and weather proof. It is a further object of this invention to provide an apparatus that easily and conveniently can be raised or lowered into position and that provides a safe, secure and reliable means of providing electricity and/or data. It is a final object of this invention to provide an apparatus that can be used as a secure, electric vehicle charging station This invention relates to improvements in under floor electrical access boxes and more particularly to in ground electrical access box with an above ground detachable tower containing limited receptacles with no weather protection when in use. Previously, the tower had to be disconnected from the in ground box and it needed to be stored and therefore could be stolen or misplaced. Furthermore, when the tower was installed the box cover needed to be stored and thus was also very easily misplaced.

The principal objective of the present invention is to provide readily available access to electrical components that when not in use are stored underground in a secure position and when needed will pop up out of the ground ready to use and are water proof both when in use and when stored. The construction of the invention may be accomplished by use of conventional materials commonly used in construction of in ground types of enclosures. The preferred materials used in this embodiment of the invention, is carbon fiber composite construction, although many other commonly used materials are acceptable. The pop up apparatus is assembled in a simplified manner to make installation quick and easy which makes it less expensive to install. It was also the objective of this inventor that the one installing the apparatus be considered and so access to all connections are accomplished in the easiest manner possible.

Another variation of the in ground access apparatus of the present invention is an above ground installation in which the components for charging stations for the electric car are installed inside the pop up apparatus configuration. The components including the charging cables are protected inside the extremely strong enclosure. The charging cables are very expensive but to date they hang on the outside of the charging station enclosure and are susceptible to vandalism and theft. The enclosure itself of currently used charging stations is usually manufactured from light gauge metals and therefore easy to damage or destroy. The present invention is preferably made from carbon fiber and other fibers assembled in a composite matrix that makes this box nearly indestructible. And with the pop up style of this invention all the vital parts of the EV (Electrical Vehicle) charging station, including the cables, are inside the enclosure where they are safe and secure. Access to the charging cables and all the electronic devices to monitor the charging process is achieved with the simple swipe of the user's credit card or any other verification means, such as a student ID, government ID or the like.

According to the present invention this body of construction consists of two major assemblies. The outer enclosure or containment unit, which is extremely strong and serves as the platform for installation in the ground or above ground. It is a weather proof structure for connections, motor and other electrical devices needed to operate this invention.

The tower is the second assembly of this body of construction. The tower will move in and out of the containment unit. The tower contains various components and connections as may be needed for the particular installation. There are several possible ways to move the tower in and out of the containment unit including manually by the user. Unscrew the cover pull it up and latch it in place for use and then release it and let it back down into the ground again and screw the cover back down. Alternatively, a gas spring pushing the tower up and then the user pushing the tower back down into the containment unit is also an option. The preferred method is the use of a motor and gear box to drive the tower up and down. All of the manual operations must have some kind of latching system to keep the cover closed and to keep the tower open. There are other methods that may be used but will not be mentioned here.

It is the objective of this invention to meet several and varied uses. It may be installed in ground or above ground depending on the mission of the installation, such as an invisible container for electrical outlets that when needed they will pop up out of the ground ready for use. The components are water proof even when in use and so are compliant with electrical codes and so may be used in all kinds of weather and environments. The box can be driven over by vehicles and sustain no damage. Parking lots, malls, convention centers, military bases, airports and airbases are just a few of the places where this type of box is useful.

The above ground installation has several different applications for the pop up box technology. The outer box can be constructed in such a manner that it would be almost indestructible. And as mentioned earlier, it may be used as an EV (electric vehicle) charging station. Also because the box is strong and weather proof, it may be installed on marine floating docks and fixed piers to supply shore power for ships and boats. It may be used as a residential charging station such that it could be locked down into place. The security of the pop up power station for a private owner is peace of mind. Not all possible uses are mentioned, but one can see the possible uses for this invention, and they are varied and many. The one consistency of this invention is the pop up tower inside the containment box that gives instant access to a variety of electrical components and data ports in a variety of ways.

BRIEF DESCRIPTION OF THE DRAWINGS

The above and other objects of the present invention will become readily apparent by reference to the following detailed description when considered in conjunction with the accompanying drawings wherein:

FIG. 2 is an elevated view of the tower.
FIG. 3A is a plan view of the upper connector block.
FIG. 3B is an elevated view of the upper connected block.
FIG. 4A is a plan view of the lower connector block.
FIG. 4B is an elevated view of the lower connector block.
FIG. 5 is an elevated view of the power pylon.
FIG. 6A-6C are various elevated views of the sloped module.
FIG. 7A-7C are various elevated views of the flat module.
FIG. 8A is an elevated view of the cover.
FIG. 8B is a plan view of the cover.
FIG. 9 is a schematic of the electronic controller.

FIG. 11C is the apparatus in the standard installation with the tower fully open and cables attached in the modules.

DESCRIPTION OF THE PREFERRED EMBODIMENTS

Electrical connections are used in everyday applications from house hold appliances to industrial machinery and now to hybrid and fully electrical cars. Access to these electrical connections varies depending on location and need. Typically these electrical connections are in plain sight; on walls, ceilings, extension cords with multi-prong plugs and counter tops. They can also be found in floors, at or below floor level, hanging down from the ceiling, and installed into a ceiling. Connections are also used extensively outside mounted in the same manner with water resistant covers to protect from shock hazards and to protect against the environment.

Many spaces, both outside and inside, have areas or rooms that have intermittent and/or permanent need for electrical connections of both low and high voltage options, in some instances for example, in the middle of a large room or outside for charging stations and the like. These spaces may call for there to be an electrical connection without the outlet being obtrusive in nature due to having spatial and/or visual restrictions and still be easily accessible.

The present embodiment of the pop up apparatus relates to improvements to subfloor or sub-ground electrical access boxes, specifically to in-ground electrical access boxes and an above ground detachable tower containing limited receptacles with no weather protection. Currently, when the tower is disconnected from the in-ground box extra space is needed to store the tower. This can cause the detachable tower to be lost or damaged. The current invention either solves or eliminates these problems and issues.

The principal objective of the present invention is to provide easy access to electrical components stored underground in a secure and waterproof position when not in use. The construction of the invention is accomplished by use of conventional materials commonly used in the construction of these types of enclosures. The enclosure is designed to make installation quick and easy, thus minimizing the time required for installation and ultimately cutting the cost to the consumer.

According to the present invention the first embodiment of construction consists of four major assemblies: a containment unit 100, a tower 200, a power pylon 500, and module 600, 700. It is readily apparent that the above-described embodiments have the advantage of wide commercial utility. It should be understood that the specific form of the invention hereinabove described is intended to be representative only, as certain modifications within the scope of these teachings will be apparent to those skilled in the art. Accordingly, reference should be made to the claims in determining the full scope of the invention.

Containment Unit

Figure 1A:
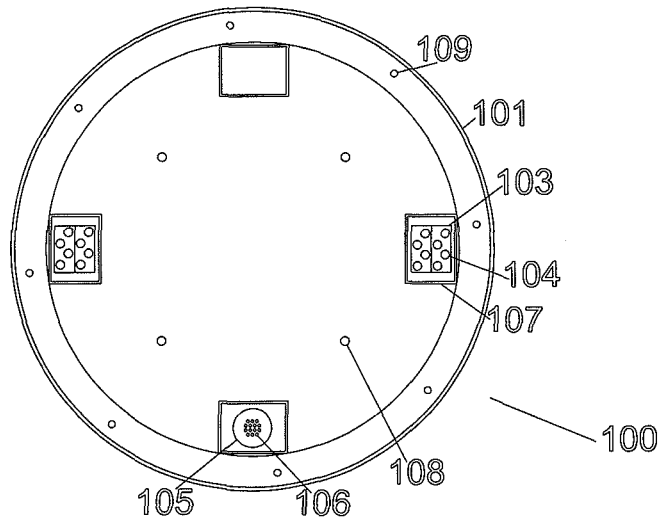
FIG. 1A is an elevated view of the containment box.
Figure 1B:
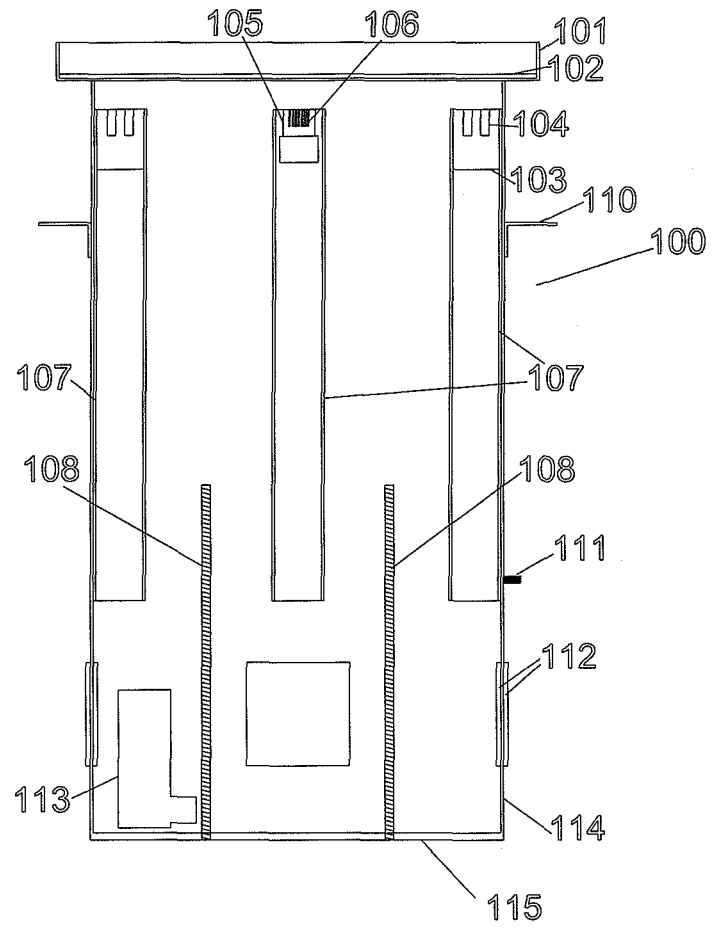
FIG. 1B is a plan view of the containment box.
Figure 10:
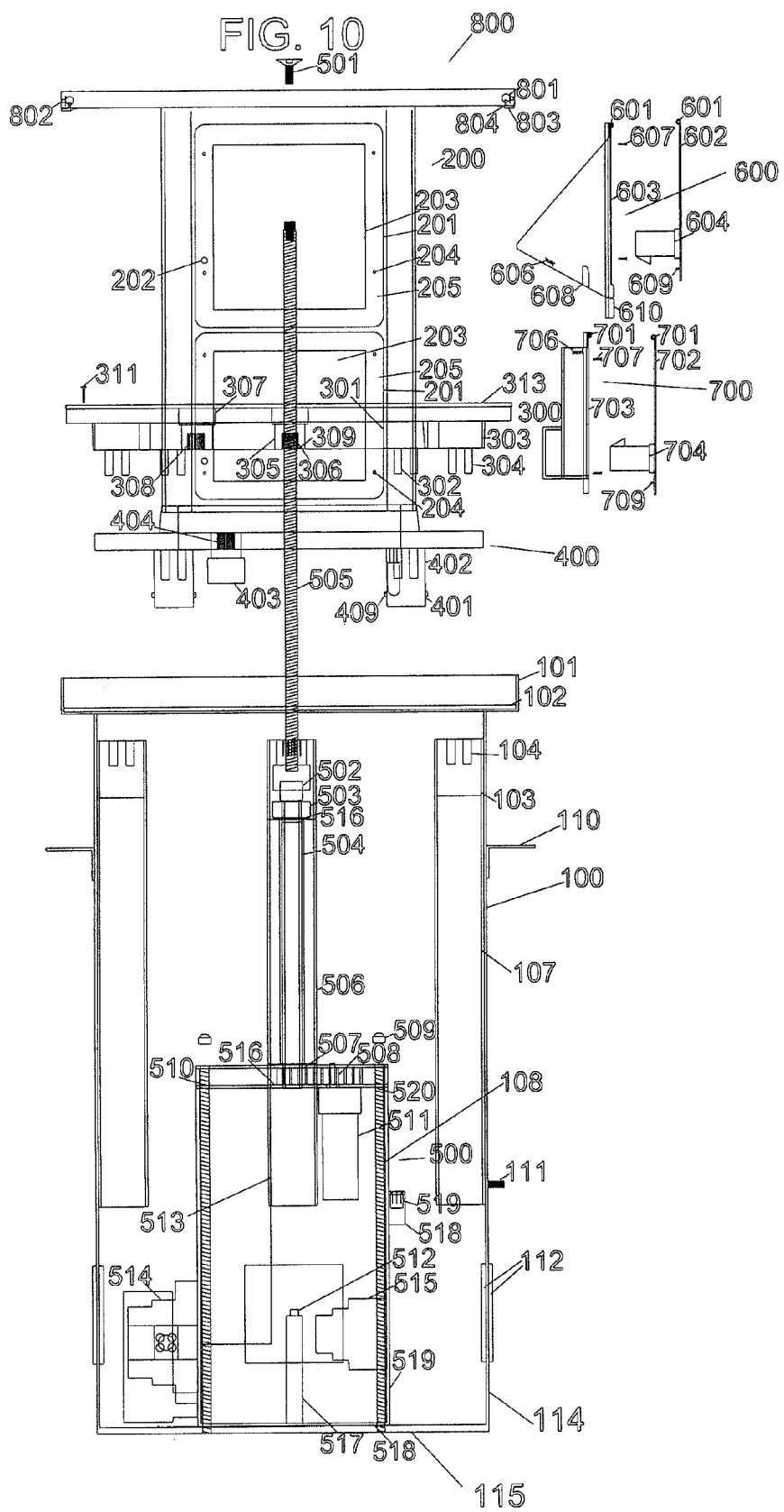
FIG. 10 is an elevated view of the complete Pop up Apparatus.
Figure 11A:
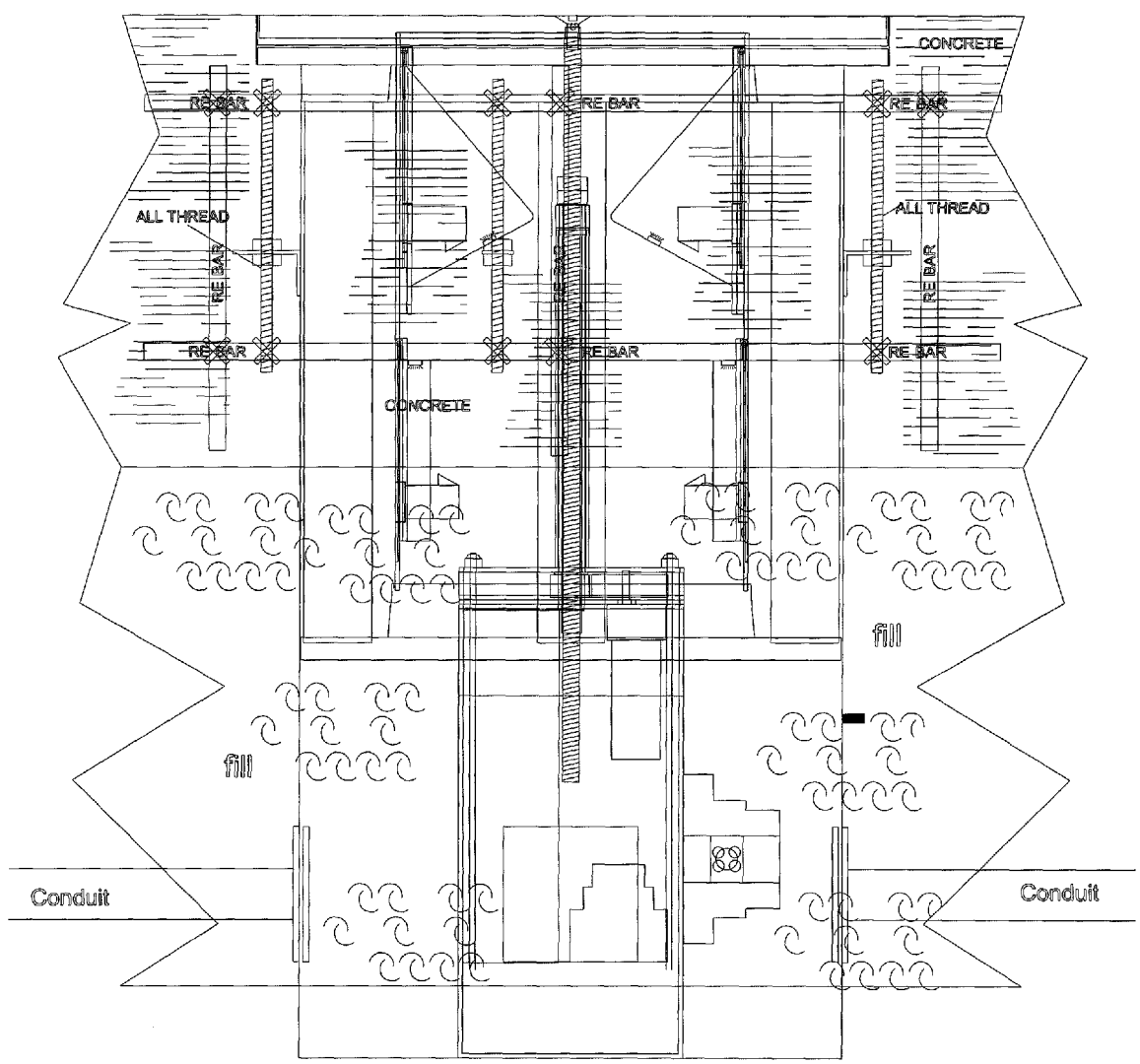
FIG. 11A is the pop up apparatus fully closed in the standard art of concrete installation.
Figure 11B:
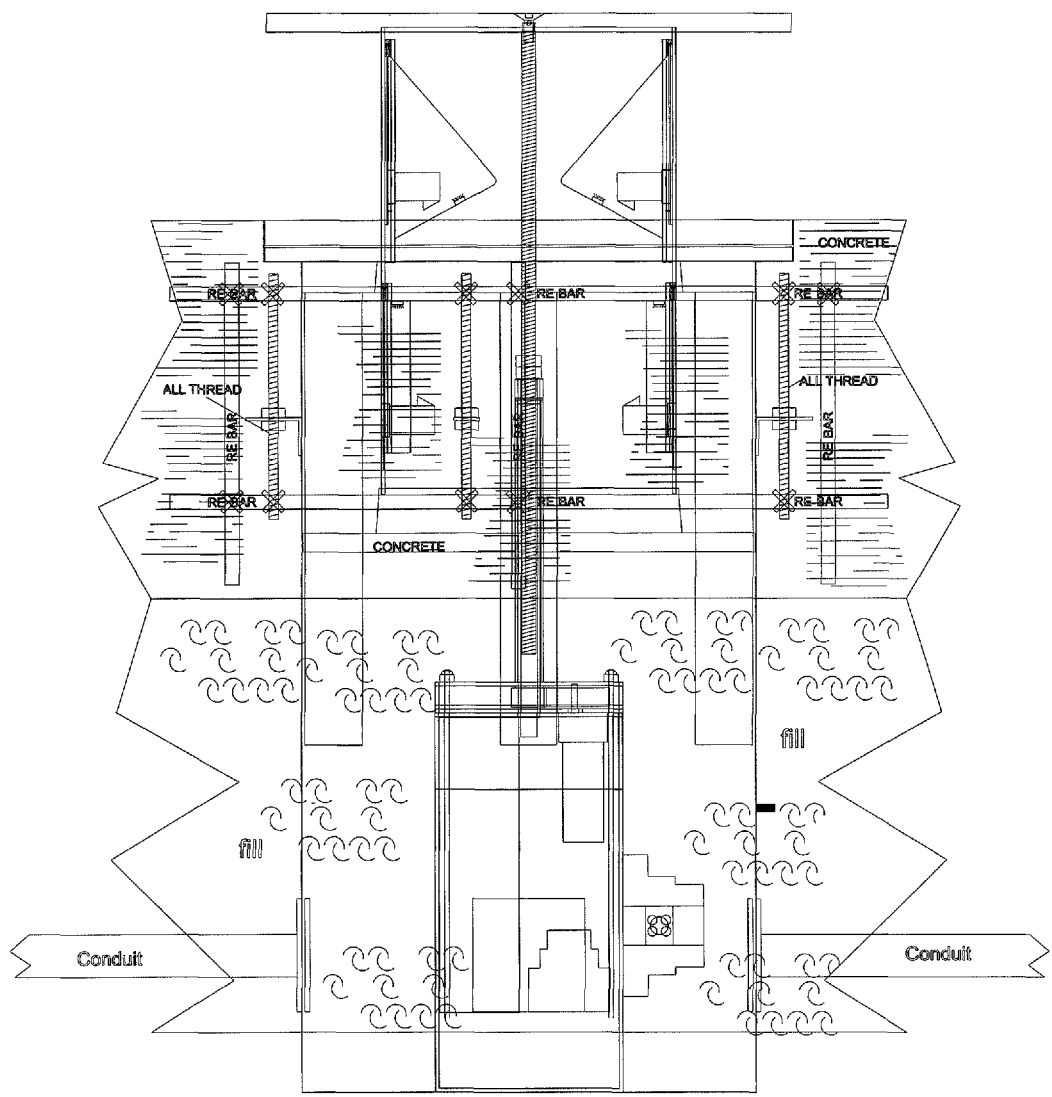
FIG. 11B is the standard apparatus in concrete installation part way up.
Figure 12A:
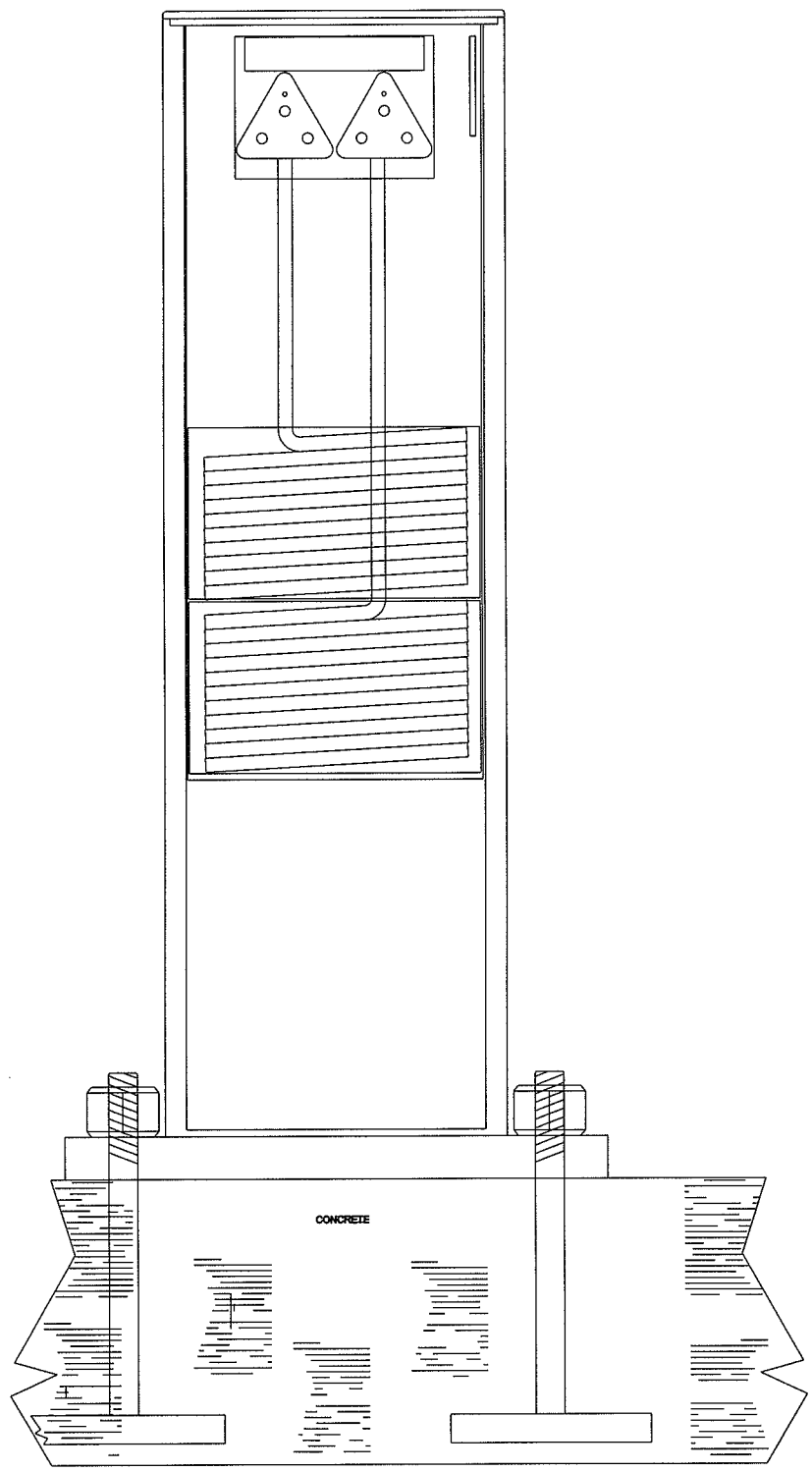
FIG. 12A is the above ground pedestal mount of an EV (Electric Vehicle) Charging station in the closed position.
Figure 12B:
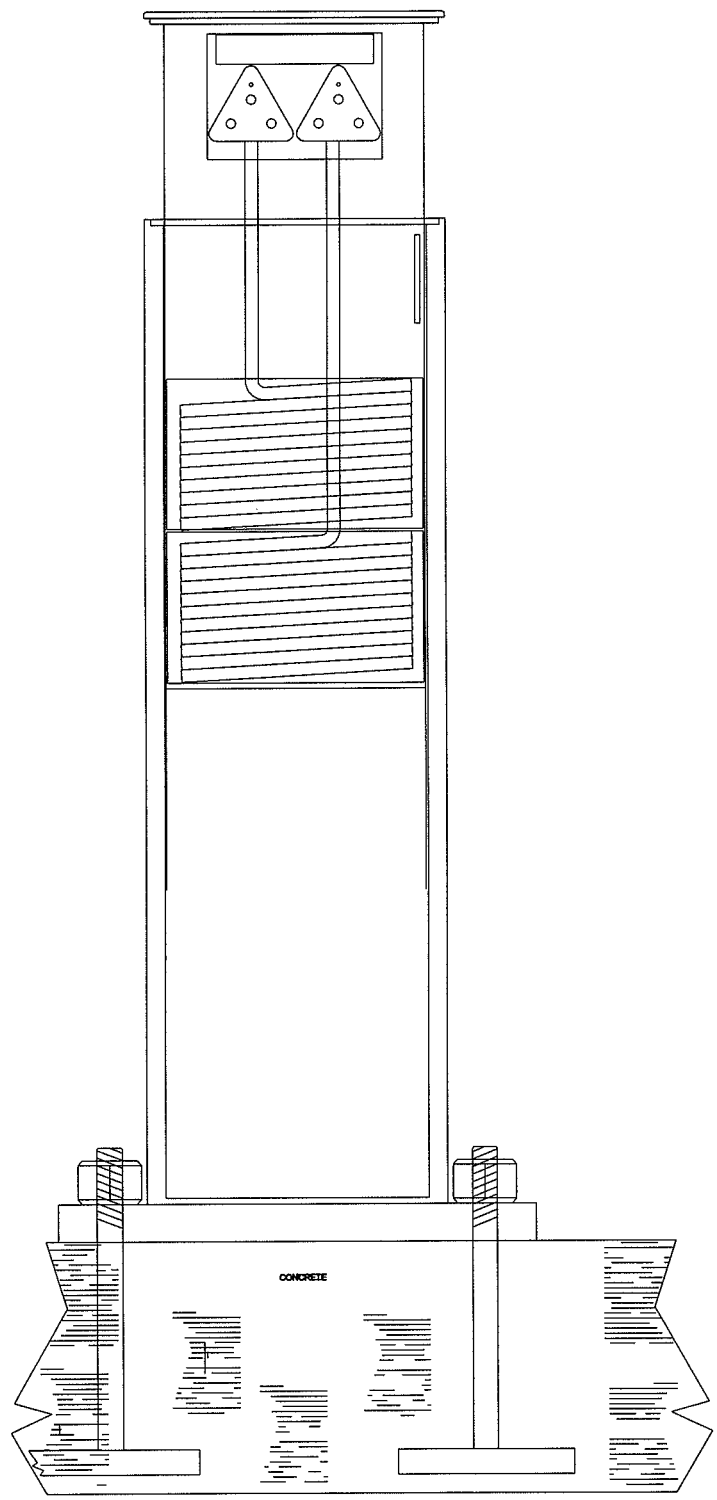
FIG. 12B is the above ground pedestal mount of an EV (Electric Vehicle) Charging station in the full open position.
Figure 13:
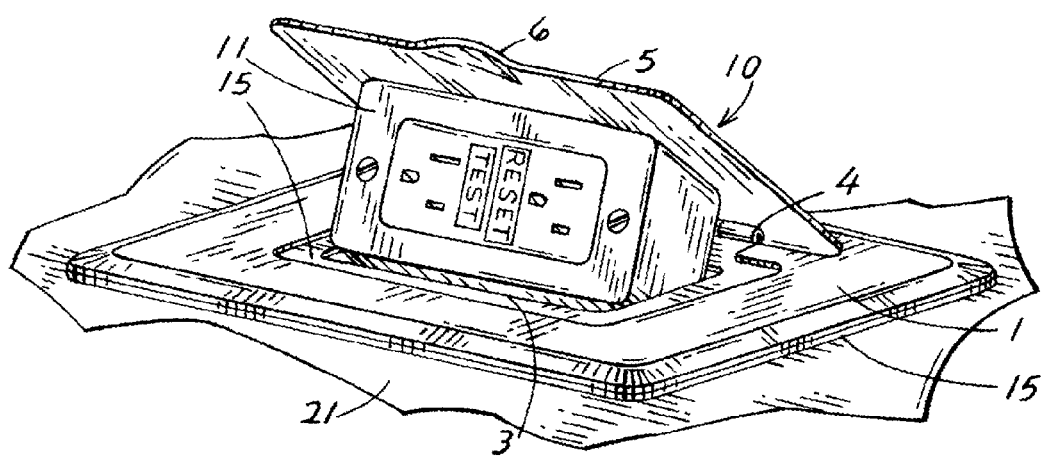
FIG. 13 (Prior Art) There are 2 other pop up style apparatuses currently available and both are designed for and used in an inside countertop configuration. They both carry one component and cannot be used outside. When both the units are in use they are not water proof. One is a Thomas and Betts product and the other is U.S. Pat. No. 6,046,405 to Obermann.

In a first embodiment, with reference to FIGS. 1A and 1B (showing the box from a side view (FIG. 1B) and an elevated view of the top (FIG. 1A), the containment unit 100 is a water proof structure designed to house electrical connections that are made between line wires entering the containment unit 100 through the conduit connection flats 112 and connecting to the power distribution blocks 513. This unit 100 consists of a circular base 115 with side walls 114 and an open top with crown 101. The containment unit 100 is made from readily available materials strong enough to maintain its shape under large loads, specifically, when installed underground the unit will have weight applied on the top, whether it be people, cars, trucks, aircraft or the like. Thus, the unit must be able to withstand pressure, weight and force. Containment unit 100 also provides the housing for tower 200 (FIG. 2) and all parts within tower 200. Crown 101 an inverted ring with a gasket 102 mounted on the horizontal surface to form the platform for cover 800 (FIG. 8) and upper connector block 300 (FIG. 3). Gasket 102 provides a water proof seal when the unit is in the closed position. The vertical edge of the crown 101 serves as the form for the finish grade for containment unit 100 when installed in concrete. The upper connector is secured to the crown using screws via screw holes or Nut certs 109 that are positioned around the crown 101 to secure upper connector block 300 (FIG. 3).

In FIG. 1 there are four wire ways 107 shown and these wire ways 107 are attached to the inside side walls in four places to protect wiring (not shown). In this embodiment one of the wire ways is left empty so as to provide an option for an installer to add data lines or communication lines. This is important that these lines be separated from the electrical lines as the electrical lines can interfere with the data lines. The remaining three wire ways 107 are used for electrical wiring for the device. All the wire ways 107 serve as the mount for connector 103, containing pin receptacle 104, and low voltage (LV) connector 105, containing LV pin receptacle 106. These also serve as guide rails for the motion and movement of tower 200. Anchors 108 are attached to the base 115 of containment unit 100 to mount power pylon 500 (FIG. 5), when the unit is configured to be raised and lowered with a power unit. In this powered embodiment anchors 108 are threaded rods. Ground stud 111 is mounted to the side 114 of containment unit 100 and is there to ground the unit. A heater 113 may also be installed into containment unit 100 to prevent moisture in the containment unit 100. Conduit entry flat 112 is built into or attached to the side of containment unit 100 in order to attach incoming conduit to a round surface. Installation brackets 110 are installed to the outside of the side 114 of containment unit 100 to facilitate underground installation. As is known in prior art, in ground boxes are held in position via all thread attached to the rebar, used in a concrete pour. The all thread in turn is attached to the containment unit 100 by running the all thread through the hole in the installation brackets 110. The installation bracket 110 is sandwiched between two nuts, one above the bracket 110 and the other below. The nuts may be moved up or down on the all thread to level the containment unit 100 and particularly the upper edge of the crown 101 with the finish grade of the concrete pour.

The line wiring that is attached to the power distribution blocks (PDB) 514 passes through the wire ways 107 and connect to the pin receptacles 104 which are mounted in the receptacle 103 which are mounted to the top of the wire way 107. The low voltage connector 307 has several sources of wires. The wires may come from the low voltage transformer 513 directly. They may come through the PLC 515 as control circuitry. Or as low voltage wiring coming in through the conduit entry flats 112 where they enter directly into the bottom of the wire way 107. They attach to pin receptacle 106 which is mounted in the connector 105 mounted at the top of the wire way 107. The wire ways 107 provide a protected passage for all wires from the bottom of the unit 100 to the top of the unit 100 and serve as a guide for the tower 200 as it moves up and down within the containment unit 100.

The high voltage and low voltage connections are made through their respective connectors. As the upper, first connector block 300 is installed on the crown 101 the connector 305 and its pins 306 and pins 304 and its connector mate 303 with the pin receptacles 106 and 104 which are mounted in their connector 105 and 103 which are mounted at the top of the wire way 107. The wire ways are mounted to the side wall 114 of the containment unit 100. Connector pins 306 and 304 are connected by the wires (not shown) that are molded in the first connector block 300 to the connector pins 308 and 302 respectively which are mounted in their connector 307 and 301 which are mounted in the upper, first connector block 300. Then as the tower 200 is moved to the full up position the pins 308 and 302 in the connector 307 and 301 which are mounted in the upper connector block 300 contacts the pin receptacles 404 and 402 which are mounted in their connector 403 and 401 which are mounted in the lower, second connector block 400 which is attached to the tower 200. From these pin receptacles 404 low voltage (LV) and 402 high voltage (HV) wires run to the various components mounted in the tower 200.

At the top of the containment enclosure 100 is the crown 101 which is an inverted ring. On the horizontal surface of the crown 101 is the gasket 102 that provides a watertight seal between the upper, first connector block 300 and the crown 101. The upper edge of the inverted ring that forms the crown 101 is the finish grade for the concrete if the unit is installed in the concrete.

Tower

Tower 200 (FIG. 2) is the second assembly of this first embodiment body construction. Tower 200 is constructed with commonly used materials that are strong enough to provide structure and protection for all items installed within. The tower consists of a square structure with mitered corners, however, the design is not limited to a square tower as it could be round, rectangular, oblong, or any other design. A recess 205 is located on the side of tower 200 to provide a flush mount for the module and door. Within recess 205 is an opening 203 for the module 600, 700 to pass through when installed in the tower. The holes 204 are for mounting the module 600, 700 with screws 606, 607. Switch 202 is installed inside the tower, positioned in line with hole 206 so that the PLC 515 knows that the door is closed and it is safe to bring the tower down. A gasket 207 is installed to recess 205, to waterproof the module installation.

Cover 800 (FIG. 8) is attached to the top of tower 200 (FIG. 2). This is manufactured of materials of sufficient thickness and toughness to bear large loads without breakage or deformity. Molded into the perimeter of the cover 800 are LED lights 802 for visual identification when the tower is in the open position. The lights are turned on as a function of the first and second connector blocks 300 and 400 coming together as described above. First safety ring 801, and its counterpart second safety ring 803 are mounted around the perimeter of cover 800. Membrane 804 is used to cover first and second safety rings 801, 803. The membrane 804 is attached to second safety ring 803 and to the bottom of the cover 800 to allow the second safety ring 803 to hang below first safety ring 801. The first safety ring 801, and second safety ring 803 are only active when the tower is within one inch of being fully closed. In this situation, if the safety ring is touched, the lower ring 803 will be moved up to where it contacts the upper ring 801 sending a signal to the PLC 515 and reverses the direction of the tower 200. Cover 800 is permanently attached to tower 200 by various methods depending on the materials used.

Second connector block 400 (FIG. 4) is attached permanently to the bottom of tower 200 (FIG. 2). The overall shape of lower connector block 400 will match the inside shape of containment unit 100 (FIG. 1), which in this embodiment is circular. Around the perimeter of lower, first connector block 400 is notch 406 which coincides with the position of wire way 107 in containment unit 100. The shape shown is to reduce surface friction. In the center of second connector block 400 is open space 407 for clearance of power pylon 500 (FIG. 5) mounted to the bottom of the containment unit 100.

Second connector block 400 (FIG. 4) has two thicknesses. The lower portion is made of material of sufficient strength and thickness to solidly mount the connectors of differing wires. The upper portion of the second connector block 400 is tapered on the outside edge to match the taper on the first connector block 300 (FIG. 3), forming a watertight joint when the tower 200 is in the full up position. Pass through 405 is made for wires (not shown) to go through lower connector block 400, from connectors 401 containing pin receptacle 402, and connector 403, containing low voltage pin receptacle 404, to inside tower 200 (FIG. 2). Pin 409 is installed in second connector block 400 in position to coincide with pin receptacle 519. Lower connector block 400 will also transfer any forces directed perpendicular to the motion of tower 200 (FIG. 2) into the surrounding containment unit 100 (FIG. 1). Lower connector block 400 will be attached to tower 200 using standard methods related to the materials used.

First connector block 300 (FIG. 3) upper portion is made to the general shape and size of crown 101 (FIG. 1) and secured by screw 311. The lower portion of the first connector block 300 is made to the same size and shape as the inner wall of the containment unit 100. Gasket 313 is installed to the top of upper connector block 300 to form a seal between the cover 200 and the first connector block 300. The opening 312 in the middle of the first connector block 300 is for a pass through for the tower 200. It is dimensioned such that it is approximately the same size as the outer size and shape of tower 200 (FIG. 2). The lower, thicker portion of the first connector block 300 is also tapered to match the upper portion of the second connector block 400 to form a watertight seal. The first connector block 300 should be made from materials with sufficient strength to not fracture when forces are applied from all directions.

First connector block 300 should also be constructed to an overall thickness to fully enclose connectors 301, 303, and low voltage connectors 305, 307. There should be no gap between first and second connector blocks 300, 400 when the tower 200 is in the full up position. It should be noted here that the first connector block needs to be between the cover 800 and the second connector block before 400 and 800 are attached to the tower. Connector 301 containing pin 302, and low voltage (LV) connector 307 containing LV pin 308, are mounted in the same position as the coinciding connector 401, 403 (FIG. 4) in second connector block 400. Switch 309 is mounted in upper connector block 300 as a limit switch to stop motor 511 (FIG. 5) when tower 200 is in the fully up position.

First connector block 300 has two thicknesses. The upper portion is made to the size and shape of crown 101 (FIG. 1). Thickness is determined by the thickness of cover 800 (FIG. 8A) on tower 200 (FIG. 2). This allows cover 800 to be flush with the top of crown 101 when lowered and closed. The lower portion is made to the size and shape of containment unit 100. The outer edge of this lower section is the same size and angle as the inside edge of the inside of the containment unit 100. This fit allows the forces applied to the first connector block 300 to be transferred to the containment unit 100 and the surrounding area. This allows the unit to support more weight. First connector block 300 is mounted to containment unit 100 using matching screws 311 that attach to inserts 109. The lower portion extending into containment unit 100. Connector 303 containing pins 304, 305 containing Iv pin 306 match the position of the connector 103, 105 mounted in containment unit 100. There is a gasket 102 between the first connector block and the horizontal portion of the crown 101 for water tight fit.

There are several methods to extend and contract the tower 200 within containment unit 100. The tower 200 could be raised or lowered into the up and down positions manually, simply by lifting the tower up and locking it in place. Alternatively, the tower 200 could be lifted manually but with a mechanical assist, such as a spring or other mechanical device to assist in raising the tower out of the containment unit. Finally, the tower 200 could be raised or lowered using a powered system. These embodiments are more fully described below.

Power Pylon

Power pylon 500 (FIG. 5) encompasses all the components for moving the tower 200 (FIG. 2) in and out of the containment unit 100. In this embodiment the raising and lowering motion is achieved through motor 511, gear box 510 and acme thread 505. Power pylon 500 is made from material with sufficient strength to withstand the forces from the raising and lowering of the tower from the containment unit 100. These forces can be both rotational and planar.

Gearbox 510 is mounted to the top of power pylon 500. The motor 511, is mounted to the bottom side of the gear box 510 and has sufficient horsepower and torque to raise and lower the tower 200 and all its components. The Acme thread 505 is installed through torque tube 504 Acme nut 502 and bushing 516 inside gearbox 510.

Shaft stabilizer 506 is attached to gear box 510 to support the acme nut 502, acme thread 505 and stabilizes the column. Torque tube 504 is installed over acme thread 505 inside shaft stabilizer 506. Torque tube collar 503 is attached to torque tube 504. Bushing 516a is installed between torque tube collar 503 and shaft stabilizer 506. Acme nut 502 is installed above torque tube collar 503 on torque tube 504. The end of acme thread 505 has an inner thread for attaching screw 501. The Acme thread 505 is attached to the cover 800 and drives the tower 200 in and out of the containment unit 100.

Power supply 513 is mounted to the inside wall of the power pylon 500. The power supply 513 receives input from incoming wires and converts that power from 110 volts to 12 volts. As the motor 511, Programmable Logic Control (PLC) and all the control circuitry and lights are low voltage we need to convert the power to 12 volts. Programmable logic control (PLC) 515 is also attached to the inside wall of power pylon 500. Switch 512 is attached to support 517 which is attached to the bottom of power pylon 500. This switch is the down limit switch that tells the PLC that the box is closed. Power distribution blocks 514 are attached to the inside wall of power pylon 500. Pin receptacle 518 is attached to the outside wall of power pylon 500. These pins are connected by wires to the first and second safety rings 801, 803 and connect the first and second safety rings 801, 803 to the receptacle that are attached to the PLC 515. This connection must be made in this way because in the preferred embodiment there is no power to the tower when the tower is in travel. These pins only connect when the tower 200 is within 1 inch of being fully closed. That way the safety rings 801, 803 are engaged for a short period of time. There is a detent near the top of the pins 518 so that the circuit is interrupted and the tower 200 may go all the way down into the containment unit 100. The power pylon 500 is held down to the bottom of the containment unit 100 with the use of the four (4) threaded rods anchor 108 at the base 115 of the containment unit 100. These rods are quite long so the attaching nut that hold the power pylon 500 in place can be attached at the top of the power pylon 500. Holes in both the bottom of power pylon 500 and gearbox 510 are placed to coincide with the position of anchor 108 (FIG. 1) on containment unit 100. In this embodiment power pylon 500 is secured by nut 509 screwed onto anchor 108.

Module

Electrical components are installed in module 600, 700 (FIGS. 6 & 7) and then the module is installed into tower 200 (FIG. 2). Module 600, 700 is made from material with sufficient strength to support components of various shapes, sizes, and weight. FIG. 6 shows a sloped module 600 and FIG. 7 shows a flat module 700. Both ramifications have flange 615, 715 for mounting to tower 200. Door 602, 702 have lock 604, 704 installed to close and lock the component when the tower is up. This is to prevent inadvertent unplugging of connections and to keep water out of the component if there is a wash down when the tower 200 is up. Door 602, 702 is attached to module 600, 700 with hinge 601, 701. Door 602, 702 has pin 609, 709 on the closing side. When door 602, 702 is closed pin 609, 709 passes thru hole 611, 711 in flange 615, 715 to activate switch 202 (FIG. 2) on tower 200. The switch 202 serves a dual purpose in that it tells the PLC 515 that the door is closed and it is safe to retract the tower 200 and turn off the light 606, 706 in the module 600, 700. Light 606, 706 source is installed on the inside module 600, 700. Gasket 603,703 applied to flange with sticky back tape or glue or some other approved method. Screw 607, 707 is used in hole 612, 712 to secure module 600, 700 to tower 200 (FIG. 2).

Catch 608 is installed on sloped module 600 for lock 604. It is positioned to close door 602 completely. Offset 610 is formed on flange 615 of module 600. Cutout 613 is positioned on hinge 601 side slope of module 600. Cutout 613 size and shape depend on the component being installed.

Flat module 700 has catch 708 which lock 704 passes through. Module 700 is the correct size for lock 704 to hold door 702 fully closed. Cutout 713 is positioned in module 700 opposite door 702. Cutout 713 size and shape varies for the component being installed.

There are other methods to raise and lower the tower 200, such as manually. This method would require some sort of latching system to hold the tower 200 down in the containment unit 100 and then to hold the tower in the full up position. A handle would be installed flush or otherwise into the cover. A locking mechanism would set once the tower was at the determined height and allow it to fall back into the closed position. A locking mechanism would then be engaged to lock the tower in place. The latching system would have to be sophisticated enough to be easily manipulated by the user.

Additionally, a gas spring can be put in place of the power pylon to push the tower out of the containment unit. A locking mechanism would then be engaged to lock the tower in place. A button or other actuator would be pushed to unlock the tower and operator would apply enough force to push the tower back into the containment unit.

A hydraulic or pneumatic cylinder can also be used to open and close the tower. A valve, switch, button etc. would activate the cylinder pushing the tower out of the containment unit. Reversing action would make the tower retract into the containment unit. Other various motion configurations can work with the same results, such as a scissor lift, rack and pinion, pulley, etc.

Operation

First Embodiment

The manner of using the Pop up apparatus in this embodiment is to provide access to various electrical components. The pop up apparatus is installed in a manner sufficient to allow the tower to open and close above or flush with surface. Wiring is run into the Pop-up apparatus through conduit entry points. Power is provided to the power distribution block. However, when the pop up apparatus is in the closed, or down position the power is disconnected from the tower assembly. In the closed position the cover and crown are flush with surface installation.

To access the electrical components the operator activates a switch, either on the cover or via a wireless connection, thus activating the motor inside. The motor drives the tower to its full open, up position. This engages connections between the first and second connector blocks, providing power to the components. Components are accessed by opening the module door and plugging in the appropriate plug. The door can be closed and secured with lock while allowing sufficient space for cord clearance.

Upon completion of use, all plugs are removed and module door is closed. Switches inside the modules verify that the module doors are completely closed and secured before the motor can be activated to return tower to closed, or down position. A safety ring is provided along the underside of the cover. When activated the safety ring mechanism will reverse motor direction and will return tower to the full open position. The safety ring is activated if there is an obstruction between the cover and the crown during the closing process, and will reverse the motor so as to prevent injury. If there are no obstructions the tower will return to the closed position.

Description of Above Ground Mount Electric Car Charging Station

The electric vehicle charging station (EV) is one above ground application of the pop-up apparatus that deserves expanding upon.

In this embodiment the below ground containment box is alternatively employed as a pedestal above ground. This is accomplished by using a mounting flange that is attached to the ground with 4 bolts. These bolts are anchored in concrete by common method. The pedestal is constructed to withstand a vehicle impact without serious damage to its inner workings. The size of the pedestal should be large enough to be easily seen and tall enough to access a user validation, verification system, such as a card reader, and car charging cables without excess reaching or bending over. This will be approximately 40" tall when the tower is in the closed, or down position.

Installed on the pedestal will be the user verification system, that could be a card reader that initializes the activation of the EV. This system could be a credit card reader, an ID reader, or any other system that would allow a qualified user access to the system. When the EV unit is activated by the consumer the tower will move up and out of the pedestal, carrying with it the charging cables and a retracting drum to which the cables are attached. After the tower is in the full open and up position the consumer can remove the cable from its seat. The user can then plug this into the receptacle on the electric vehicle. The computer interface between the car and the electric provider will connect and charge the battery. If during any time the connection is broken between the car and the EV unit, the unit will turn off and the cable or cables will be retracted by motor driven drums. When the cable is back in the seat the tower will automatically return to the closed position.

If the cable is released from the car prior to being finished with charging, it may not be plugged into that or another vehicle until the tower has been returned to the fully closed position and is the re-released into the up position. This prevents the theft of power from one vehicle to another. Currently the connector available in the EV unit is the standard SAEJ1772 Combo Connector. With this connector the consumer will be able to quick charge or slow charge their vehicle.

All transactions will go through the network attached to the owner of the individual EV unit. In other words, the present application is only for the mechanical box and not for the software and operational software.

The Pop up apparatus of the present invention is ideal for use in the EV industry because to date the cables have been hung on the outside of the box and all of the electronics, keypad, keypad and screens have been exposed to theft and vandalism. The cables themselves are in excess of $300 to replace and the wire value to the thief is substantial enough to make them desirable to steal. Thus, a system that is easy to access and use, that provides easy access to the cables, provides a means to charge for this access and that provides a way to secure and contain cables when not in use is extremely desirable.

CONCLUSION, RAMIFICATIONS, AND SCOPE

The reader will see that the use of this embodiment of an electrical enclosure can be used to access electrical components easily in an either an above ground position or below ground position. The enclosure can be easily secured and is able to meet visual and spatial restrictions. In addition the enclosure is self-contained and parts cannot be lost or damaged when not in use. Furthermore features can be added or removed as needed by the customer. It should be noted that various materials can be used with equal results, such as steel, stainless steel, aluminum, plastic, nylon, composites or resins, wood, concrete, etc. Welding, break forming, castings, molding, gluing, common fasteners etc. are standard methods of construction that can be used for making and assembling parts with equal results. Other embodiments, parts methods can be employed that are known in the industry that include but are not limited to the following.

The lift can be of other various motion configurations that can work with the same results; scissor lift, rack and pinion, pulley, etc. With respect to the acme thread it does not have to be limited to 1 thread and can be any number desired. With respect to the guides, the guides for the tower motion in and out of the containment unit can be separate parts from the conduit. The bearing can be a ball bearing or other type of glide installed into or below the tower. The guides can come in various shapes and sizes and match the bearing/glide. This could include wheels attached to the tower, spring rollers etc. The tower could be made as one piece or separate pieces and then assembled together. The openings in the tower could be different shapes such as round, square, triangle, elliptical, etc. and in different number or orientation depending on the size of the tower and module. The cover can have varying number and combinations of lights in available colors, sizes and positions as long as it remains structurally sound. The lights can also be excluded from the cover altogether and the cover further can be made to allow installation of other materials on top, such as wood flooring, tile, carpet, etc. The gear can be changed in size and orientation to modify the open and close speed and force of the tower. Mounting brackets can be moved from the side to the base of the containment unit, and generally the size and shape of the containment unit and tower assembly can vary depending on number components and application desired.

Although the above description contains many specifics, these should not be constructed as limiting embodiments but merely providing illustrations of different embodiments. Thus the scope of the embodiments should be determined by the appended claims and their legal equivalents rather than the examples given.

What I claim is:

1. An electric supply pop up apparatus for use in a generally horizontal surface comprising:
    a permanently installed, weatherproof containment unit where said unit has
        a bottom,
        at least one side wall and
        an open top;
    a moveable tower that has
        at least one side wall and
        a cover;
    at least one electrical receptacle in a waterproof module installed in said tower; where
    said tower is slideably moveable within said containment unit so that said tower can be raised or lowered within said containment unit such that when said tower is lowered and in a down position said tower is fully secured and enclosed within said containment unit or said tower can be raised to an up position so that said electrical receptacle module is accessible to a user;
    where power is only available to the user at said electrical receptacle module when said tower is in said up position and
    where said pop up apparatus further includes a heating element.

2. The electric supply pop up apparatus of claim 1 where said pop up apparatus can provide both low voltage and high voltage electricity.

3. The electrical supply pop up apparatus of claim 1 where said tower is moved between said up and down positions manually.

4. The electrical supply pop up apparatus of claim 1 where said tower is moved between said up and down positions via a power assist.

5. An electric supply pop up apparatus for use in a generally horizontal surface comprising:
   a permanently installed, weatherproof containment unit where said unit has
      a bottom,
      at least one side wall and
      an open top;
   a moveable tower that has
      at least one side wall and
      a cover;
   at least one electrical module installed in said tower; where
   said tower is slideably moveable within said containment unit so that said tower can be raised or lowered within said containment unit such that when said tower is lowered and in a down position said tower is fully secured and enclosed within said containment unit or said tower can be raised to an up position so that said electrical receptacle module is accessible to a user;
   where power is only available to the user at said electrical receptacle module when said tower is in said up position and;
   where said tower is moved between said up and down positions via a power assist.

6. The electrical supply pop up apparatus of claim 5 where said pop up apparatus can provide both low voltage and high voltage electricity.

7. An electric supply pop up apparatus for use in a generally horizontal surface comprising:
   a permanently installed, weatherproof containment unit where said unit has
      a bottom,
      at least one side wall and
      an open top;
   a moveable tower that has
      at least one side wall and
      a cover;
   at least one electrical module installed in said tower; where
   said tower is slideably moveable within said containment unit so that said tower can be raised or lowered within said containment unit such that when said tower is lowered and in a down position said tower is fully secured and enclosed within said containment unit or said tower can be raised to an up position so that said electrical module is accessible to a user;
   where power is only available to the user at said electrical module when said tower is in said up position and;
   where said pop up apparatus is used as an electric vehicle charging station.

8. The electric supply pop up apparatus of claim 7 where said pop up apparatus further comprises:
   a means to secure and contain electric vehicle charging components so that said components are available to a user when said pop up apparatus is in said up position but are unavailable and secured when said pop up apparatus is in said down position.

9. The electric supply pop up apparatus of claim 8 that further comprises a user access device that will qualify said user and thereafter will allow access to said electric vehicle charging components and electric power from said pop up apparatus.

10. The electrical supply pop up apparatus of claim 7 where said tower is moved between said up and down positions via a power assist.

11. An electric supply pop up apparatus for use in a generally horizontal surface comprising:
   a permanently installed weatherproof containment unit where the unit has
      a bottom,
      at least one side wall,
      a first connector block,
      an open top, and
      a crown;
   a moveable tower that has
      at least one side wall,
      a second connector block, and
      a cover;
   at least one electrical module installed in said tower;
   said tower is slideably moveable within said containment unit so that said tower can be raised or lowered within said containment unit such that when said tower is lowered and in a down position said tower is fully secured and enclosed within said containment unit or said tower can be raised to an up position so that said electrical module is accessible to a user;
   said first connector block and said second connector block are connectable to each other at said up position; and
   when in said up position said first and said second connector blocks are connected to each other and when connected power is made available to said electrical module;
   where said tower is moved between said up and down positions via a power assist.

12. The electric supply pop up apparatus of claim 11 where said pop up apparatus can provide both low voltage and high voltage electricity.

13. The electric supply pop up apparatus of claim 11 that further includes a heating element.

14. The electric supply pop up apparatus of claim 11 where said pop up apparatus is used as an electric vehicle charging station.

15. The electric supply pop up apparatus of claim 14 where said pop up apparatus further comprises a means to secure and contain electric vehicle charging components so that said components are available to a user when said pop up apparatus is in said up position but are unavailable and secured when said pop up apparatus is in said down position.

16. The electric supply pop up apparatus of claim 15 that further comprises a user access device that will qualify said user and thereafter will allow access to said electric vehicle charging components and electric power from said pop up apparatus.

17. An electric supply pop up apparatus for use in a generally horizontal surface for use as an electric vehicle charging station comprising:
   a permanently installed weatherproof containment unit where the unit has a bottom, at least one side wall, a first connector block, an open top, and a crown;
   a moveable tower that has at least one side wall, a second connector block that is connectable to said first connector block,
   a cover; and
      an electric vehicle charging components; whereby
   said tower is slideably moveable within said containment unit so that said tower can be raised or lowered within said containment unit such that when said tower is lowered and in said down position said tower is fully secured and enclosed within said containment unit, or said tower can be raised to said up position so that said electric vehicle charging components are accessible to a user and where said first and second connector block are connected thereby allowing power availability to said electric vehicle charging components;

a storage means to secure and contain said electric vehicle charging components so that said components are available to a user when said pop up apparatus is in an up position but are unavailable and secured when said pop up apparatus is in a down position;

a user access device that will qualify said user to allow access to said electric vehicle charging components and electric power from said pop up apparatus by activating said tower so that said tower is raised to said up position;

whereby when said user activates the tower, said tower is raised, power is made available and a cable for charging said electric vehicle is released and when said user is finished using said station said cable is then returned and stored within said containment unit and said tower is retracted and lowered to said secured position within said containment unit.

* * * * *